United States Patent
Hikita

(10) Patent No.: US 6,404,181 B1
(45) Date of Patent: Jun. 11, 2002

(54) PARTS CONTAINER, METHOD OF INSPECTING PARTS USING SAME, AND APPARATUS THEREFOR

(75) Inventor: Osamu Hikita, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/284,643

(22) PCT Filed: Oct. 16, 1997

(86) PCT No.: PCT/JP97/03731

§ 371 (c)(1), (2), (4) Date: Apr. 16, 1999

(87) PCT Pub. No.: WO98/17091

PCT Pub. Date: Apr. 23, 1998

(30) Foreign Application Priority Data

Oct. 17, 1996 (JP) .............................................. 8-274425

(51) Int. Cl.⁷ ............................................... G01R 31/26
(52) U.S. Cl. ..................... 324/158.1; 206/713; 206/714
(58) Field of Search ................................ 206/713, 714, 206/715, 716, 717, 722, 728; 209/573; 861/212; 324/158.1, 760

(56) References Cited

U.S. PATENT DOCUMENTS

| | | | | |
|---|---|---|---|---|
| 4,549,651 A | * | 10/1985 | Alemanni | 206/329 |
| 4,961,984 A | * | 10/1990 | Takeda | 428/192 |
| 5,101,975 A | * | 4/1992 | Runyon et al. | 206/330 |
| 5,578,919 A | * | 11/1996 | Semba et al. | 324/158.1 |
| 5,667,073 A | * | 9/1997 | Okui | 206/713 |
| 5,727,688 A | * | 3/1998 | Ishii et al. | 206/724 |
| 6,003,675 A | * | 12/1999 | Maruyama et al. | 206/713 |

FOREIGN PATENT DOCUMENTS

| | | |
|---|---|---|
| JP | 6-156562 | 6/1994 |
| JP | 7-165287 | 6/1995 |
| JP | 8-104306 | 4/1996 |

* cited by examiner

Primary Examiner—Michael J. Sherry
Assistant Examiner—Jimmy Nguyen
(74) Attorney, Agent, or Firm—Wenderoth, Lind & Ponack, L.L.P.

(57) ABSTRACT

A component engagement member (7, 27) is provided at an opening part of a container having a storage recess (5, 25) for storing a component (10, 30). The component engagement member is releasably engaged with at least a part of an upper face of the component stored in the storage recess, thereby holding the component at a predetermined position. An inspection hole (11, 31) is opened at a part of the storage recess so as to allow inspection of the component stored in the storage recess from outside. An inspection member such as an inspection pin or the like can be inserted through the inspection hole from outside of a component storage unit and brought in contact with a connecting terminal of the stored component, thereby achieving inspection to the stored component.

25 Claims, 17 Drawing Sheets

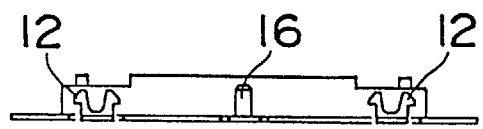
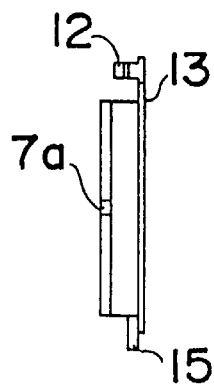
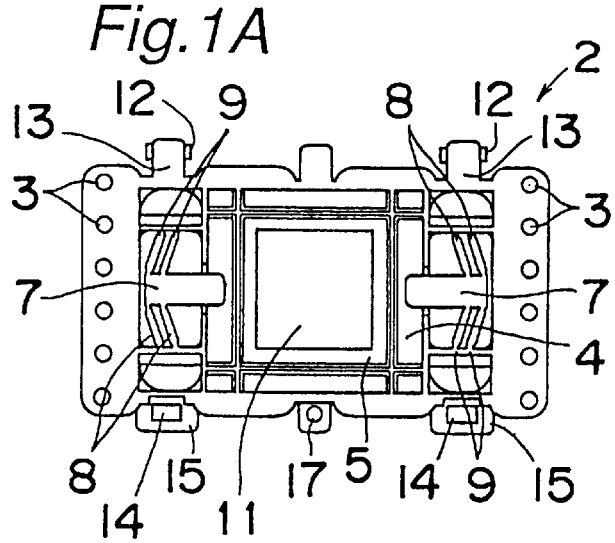
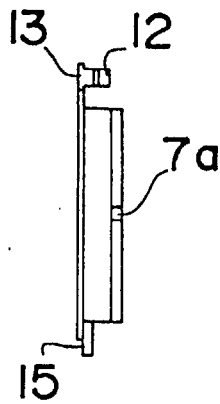
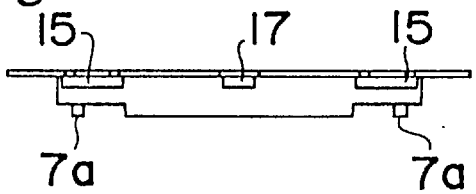
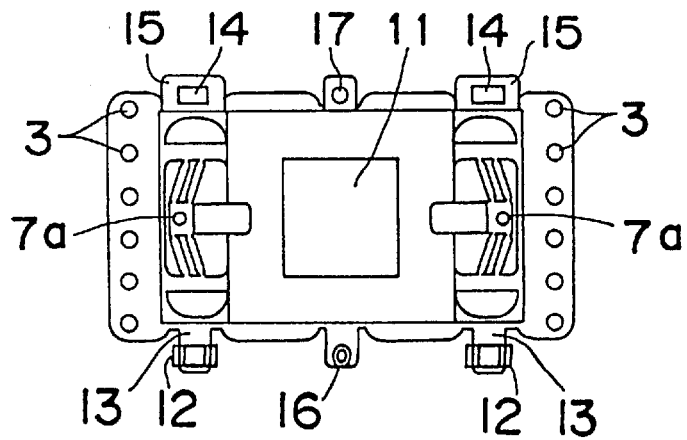

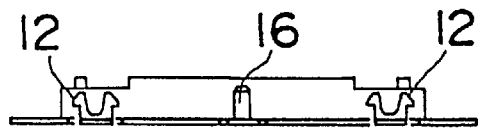
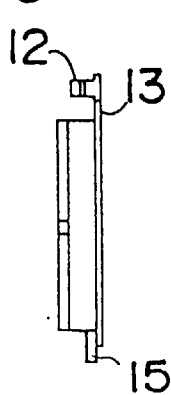
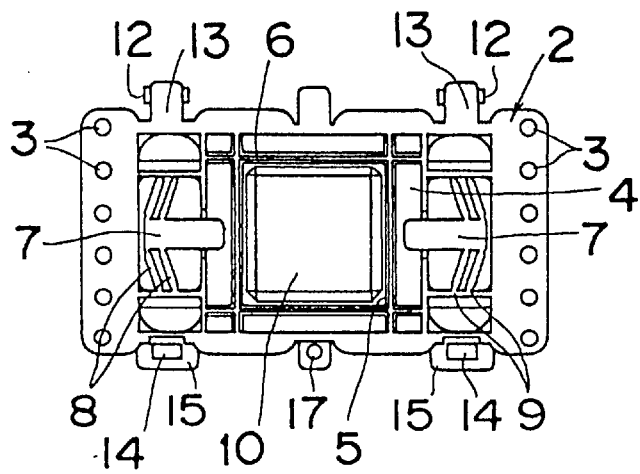
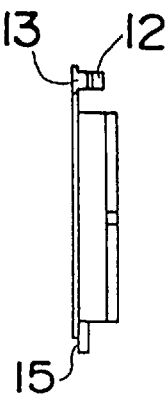
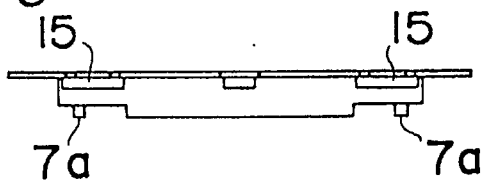
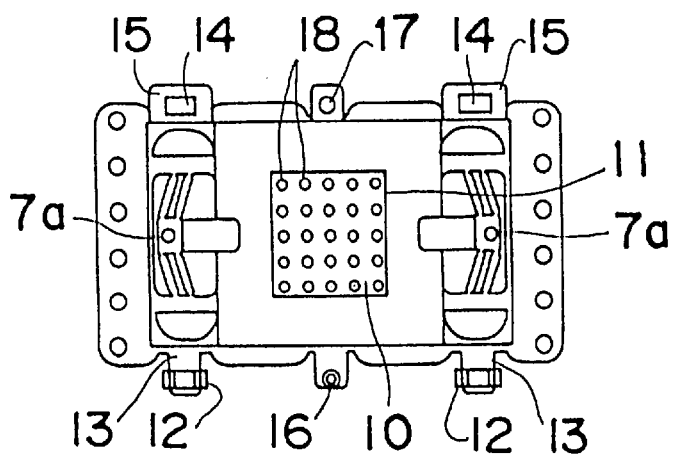

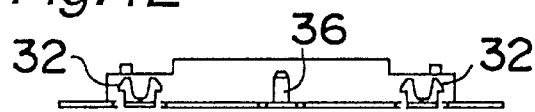
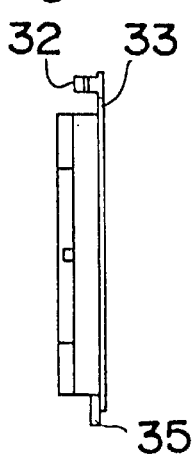
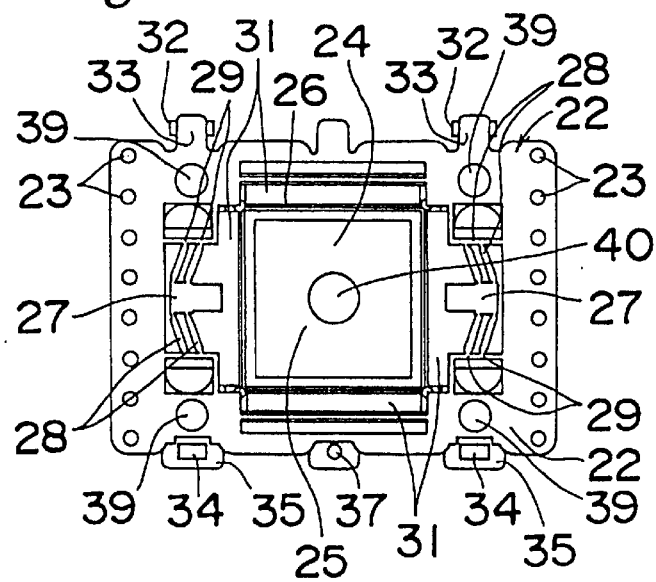
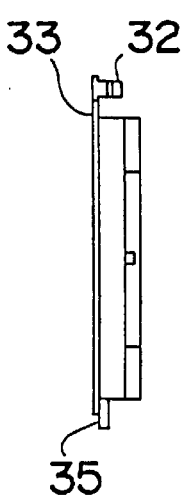
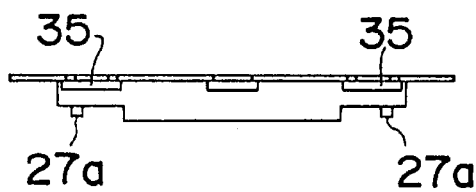
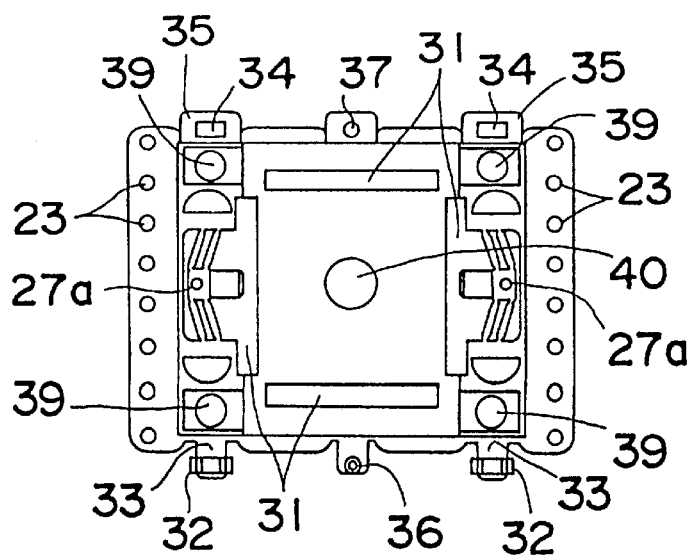

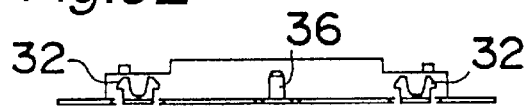
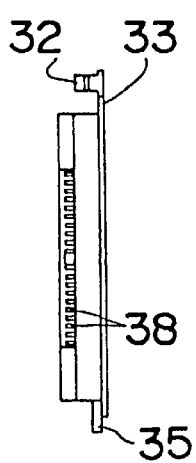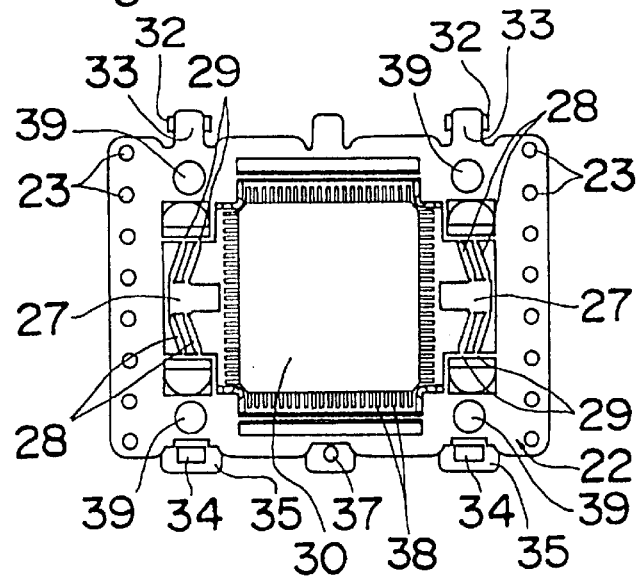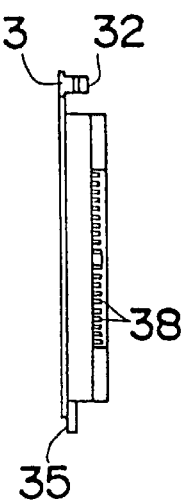
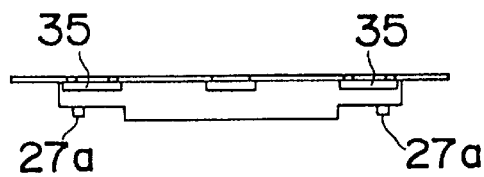
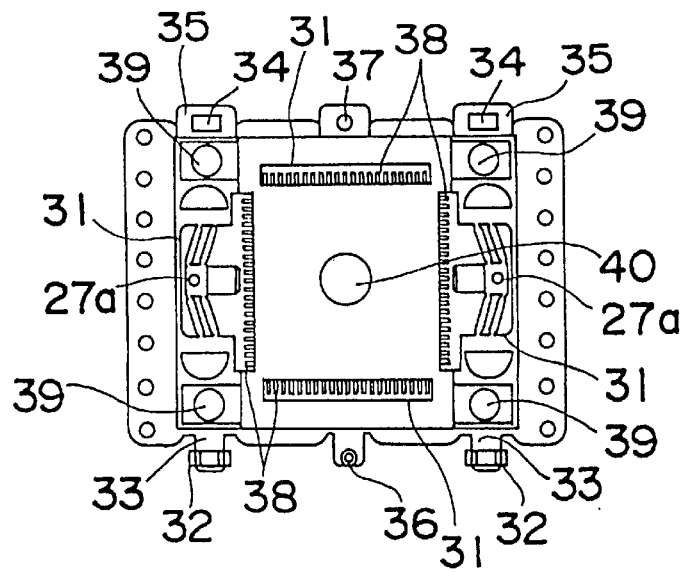

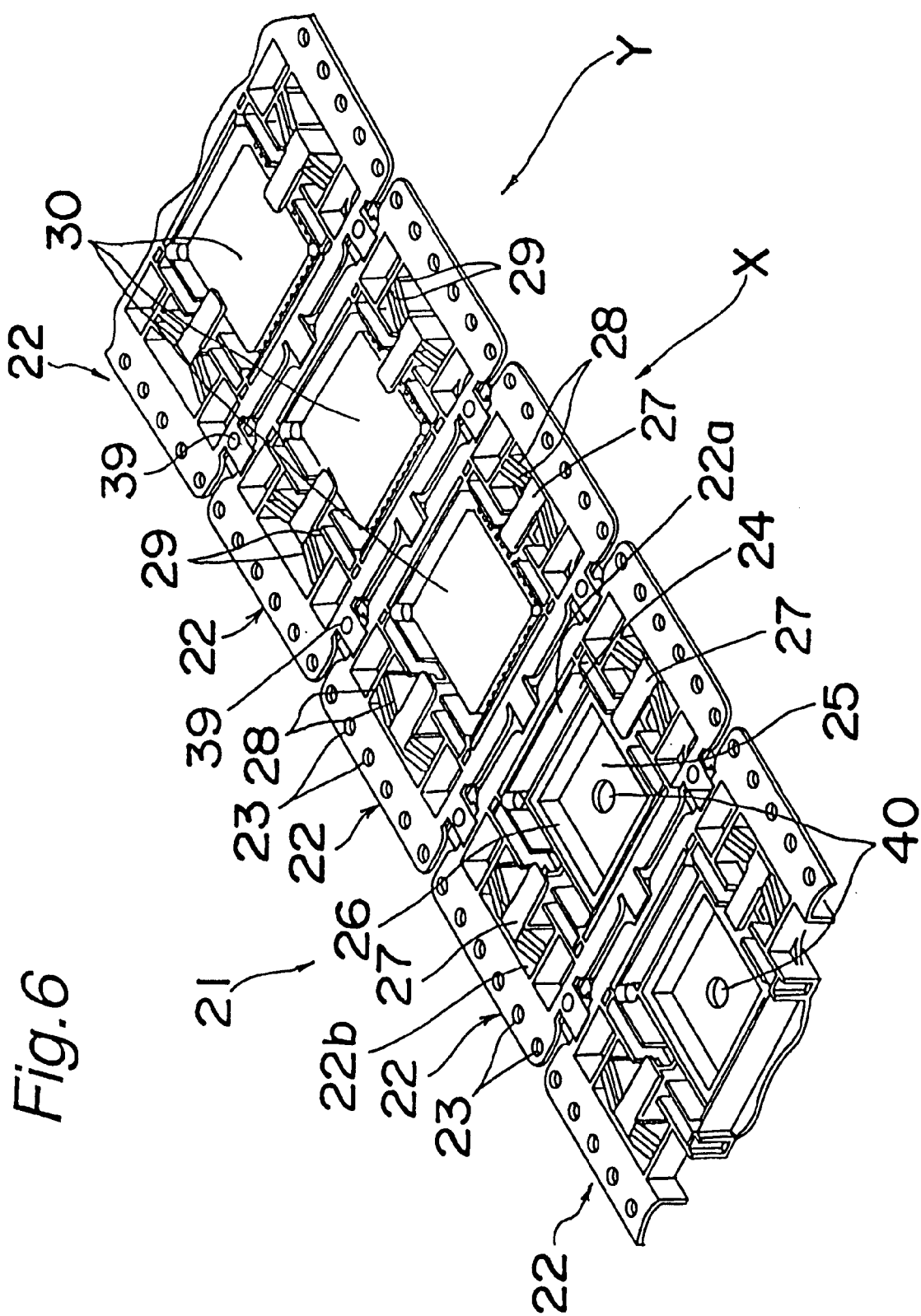

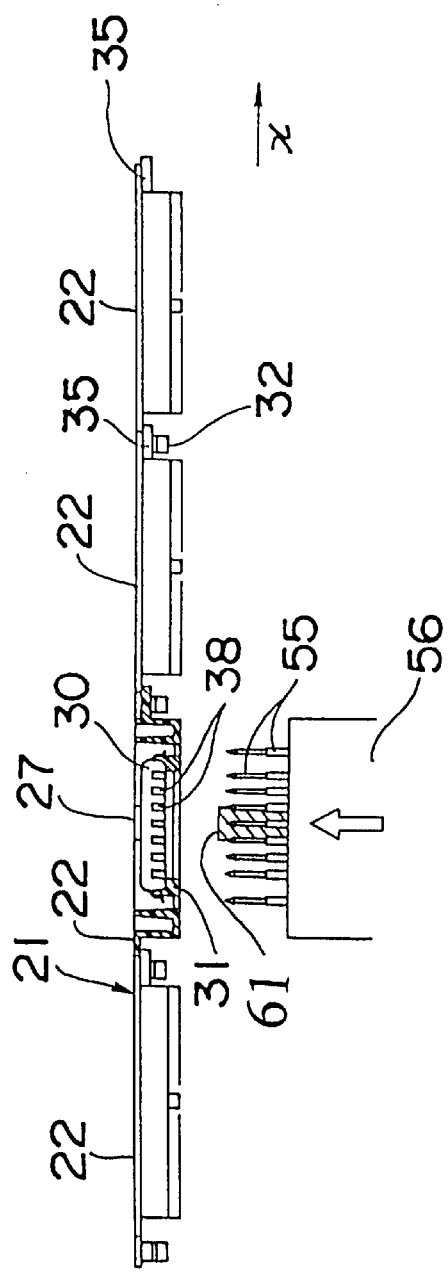

Fig.10A  PRIOR ART
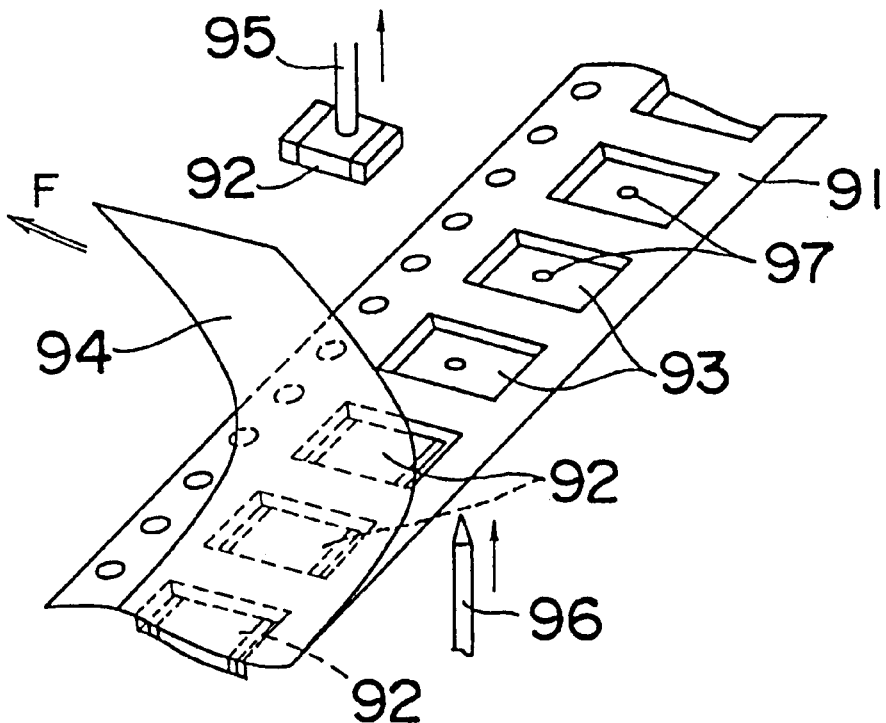
Fig.10B  PRIOR AR
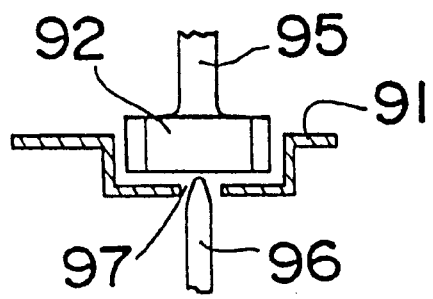

PARTS CONTAINER, METHOD OF INSPECTING PARTS USING SAME, AND APPARATUS THEREFOR

TECHNICAL FIELD

The present invention relates to a component storage unit for storing electronic components, mechanical components, optical components, etc. and a method and an apparatus for inspecting the components stored in the component storage unit.

BACKGROUND ART

Conventionally, an embossed carrier tape has been widely used as a component storage unit for storing electronic components or mechanical components. FIG. 10A is a perspective view of the embossed carrier tape. A carrier tape 91 has component storage recesses 93 for storing components 92 therein. After the components 92 are stored in the recesses, a top cover tape 94 is thermally fused or bonded securely to a surface of the carrier tape 91, so that the components 92 are held in the carrier tape. In order to take the components 92 outside, the top cover tape 94 is pulled in a direction of an arrow F, whereby the thermally fused part or bonded part is broken to release the holding to the components. In other words, actually, the components cannot be held again in the embossed carrier tape 91 once the top cover tape 94 is detached to free the engagement of the components 92.

In a modification of the embossed carrier tape, a hole 97 is provided at the center of the storage recess 93, which is used when the component 92 is pressed up by a push pin 96 from below the embossed carrier tape 91 to improve efficiency, that is, a chance of successful sucking and removal of the component 92 by a suction nozzle 95 as a suction device after the top cover tape 94 is separated. FIG. 10B is a sectional view of the embossed carrier tape 91 in a state where the component 92 is pushed upward by the push pin 96 and sucked by the suction nozzle 95. The hole 97 is sometimes utilized so as to confirm absence of the component 92 after the component 92 should have been stored in the embossed carrier tape 91 and secured by the top cover tape 94. FIG. 11 is a diagrammatical sectional view of how to confirm a state of a missing component 92. 98 is an emission part of a transmission type sensor, and 99 is a detection part of a transmission type sensor. When the component 92 is present in the carrier tape, a light B from the emission part 98 of the transmission type sensor penetrates the hole 97, but is interrupted by the component 92 and does not reach the detection part 99 of the transmission type sensor. On the other hand, if the component 92 is missing a light B' enters the detection part 99 of the transmission type sensor, whereby the absence of the component is detected. The top cover tape 94 generally comprises a transparent tape in many cases, therefore allowing the light B' to penetrate the top cover tape 94 to reach the detection part 99 of the transmission type sensor.

However, even when the absence of the component 92 is discovered, it is impossible to detach the top cover tape 94 solely at the point of the missing component, accommodate the component, and, fix the top cover tape 94 again. For solving this inconvenience, a component storage unit requiring no top cover tape is proposed and disclosed in Japanese Laid-Open Patent Publication No. 6-156562. FIG. 12A is a plan view of a component cluster formed by connecting the proposed component storage units to one another, and FIG. 12B is a front view thereof. Shutters 102 as a component pop-out prevention device are set at an opening part 107 of a component storage unit 108 having a component storage recess 106 for accommodating the component. The openable shutters 102 cover at least an upper face of the stored component. Connecting parts 109 are provided at an end part of the storage unit so that the storage unit can be coupled to the other storage unit. 103 is a projecting part for opening and closing the shutter 102, and 104 is a feed hole formed for driving the component cluster of a plurality of component storage units 108 in a connection direction. 105 is a component stored in the component storage unit 108.

Conventionally, the electronic components and mechanical components are generally inspected in units of components or subjected to sampling inspection before being stored in the component storage units and shipped as products. In the case of the electronic components, e.g., as shown in FIG. 13, the electronic components temporarily stored in an intermediate storage container such as a tray or the like immediately after being produced as products are taken outside one by one, transferred to above an inspection probe, inspected through touch with inspection pins, and finally stored in the component storage container proposed in the prior art No. 6-156562. In FIG. 13, 81 is the electronic component having connecting terminals at a lower face and arranged and stored in matrix in the tray, serving as intermediate storage container, designated by 82. 83 is an inspection station provided with inspection pins 84 of the inspection probe. 85 is a component transfer arm with a suction nozzle 86 which sucks and moves the component 81 up and down. The electronic component 81 stored in the tray 82 is sucked, transferred above the inspection probe, and moved down by the component transfer arm 85, whereby the connecting terminals are brought in touch with the inspection pins for the inspection. In the prior art) additional time for transferring the component is required in addition to inspection time, whereby inspection efficiency is deteriorated greatly. Also teaching etc. to the component transfer arm is required to transfer the component from the intermediate storage container such as the tray, etc. into contact with the inspection pin, which leads to the need for a considerable amount of time in the case where kinds of components are to be switched, etc., thus hindering a start-up of production.

The present invention has for its object to provide a component storage unit and a method and an apparatus for inspecting components using the component storage unit. The invention can eliminate transfer time for components during inspection. The invention can also teach to a component transfer device for a component transfer operation, and can improve inspection efficiency.

SUMMARY OF THE INVENTION

In order to accomplish the above-described object, the present invention is constituted as described hereinbelow.

According to a first aspect of the present invention, there is provided a component storage unit which comprises a component engagement member which is set at an opening part of a container having a storage recess for storing a component and which is releasably engaged with at least a part of an upper face of the component stored in the storage unit thereby holding the component at a predetermined position. The component storage unit has an inspection hole formed at a part of the storage recess for inspecting a state of the component stored in the storage recess from outside. The inspection hole allows an inspection member for inspecting the state of the stored component to penetrate and contact the stored component.

In another aspect of the present invention, the engagement member is an engagement element having a leading end plate-like part engaged with the component when the inspection member penetrating the inspection hole comes in contact with the stored component. As a result, the component is prevented from popping outside of the storage space.

According to a third aspect of the present invention, there is provided a component storage unit according to the first aspect, wherein the inspection member is constituted by conductive inspection pins which come in contact with connecting terminals of the stored component thereby inspecting an electric characteristic of the stored component.

According to a fourth aspect of the present invention, there is provided a component storage unit according to the first or third aspects, wherein the engagement member integrally molded of a resin material is adapted to hold an engagement release state and an engagement state by means of an elastic force of the resin material.

According to a fifth aspect of the present invention, there is provided a component storage unit according to any one of the first, third and fourth aspects, wherein the engagement member is an engagement element which is movable from the opening part of the storage recess to the engagement state, and from the engagement release state to the stored component stored in the storage recess.

According to a sixth aspect of the present invention, there is provided a component storage unit according to any one of the first, and third through fifth aspects, wherein a hole is formed in the storage recess. The hole allows a heating member of a heating apparatus that can heat the stored component when the state of the stored component is to be inspected to pass therethrough.

According to a seventh aspect of the present invention, there is provided a component cluster comprising a plurality of the component storage units to be coupled in a band.

According to an eighth aspect of the present invention, there is provided a component inspection method, whereby whether the component stored in the component storage unit is good or not is inspected using the inspection hole formed in the storage recess.

According to a ninth aspect of the present invention, there is provided a component inspection method according to the eighth aspect, whereby the inspection member penetrates the inspection hole of the storage recess to contact the connecting terminals of the component stored in the storage recess, thereby inspecting an electric characteristic of the component.

According to a tenth aspect of the present invention, there is provided a component inspection method according to the eighth aspect, whereby light is projected to the stored component from the inspection hole of the storage recess, so that a shape of the component is inspected by an optical inspecting apparatus.

According to an eleventh aspect of the present invention, there is provided a component inspection method according to the tenth aspect, wherein the shape of the component to be inspected is a state of a connecting terminal part of the component.

According to a twelfth aspect of the present invention, there is provided a component inspecting apparatus, which comprises a transfer apparatus that can transfer the component cluster defined in the seventh aspect as component storage units. Inspection pins penetrating the hole of the storage recess at a predetermined position contact connecting terminals of the component, thereby inspecting an electric characteristic of the component.

BRIEF DESCRIPTION OF DRAWINGS

These and other aspects and features of the present invention will become clear from the following description taken in conjunction with the preferred embodiments thereof with reference to the accompanying drawings, in which:

FIG. 1A is a front view of a component storage unit according to a first embodiment of the present invention;

FIG. 1B is a right side view of the component storage unit;

FIG. 1C is a left side view of the component storage unit;

FIG. 1D is a bottom view of the component storage unit;

FIG. 1E is a plan view of the component storage unit;

FIG. 1F is a rear view of the component storage unit;

FIG. 2A is a front view of a state in which an electronic component is stored is the component storage unit of the first embodiment;

FIG. 2B is a right side view of the stored state;

FIG. 2C is a left side view of the stored state;

FIG. 2D is a bottom view of the stored state;

FIG. 2E is a plan view of the stored state;

FIG. 2F is a rear view of the stored state;

FIG. 4A is a front view of a component storage unit according to a second embodiment of the present invention;

FIG. 4B is a right side view of the component storage unit;

FIG. 4C is a left side view of the component storage unit;

FIG. 4D is a bottom view of the component storage unit;

FIG. 4E is a plan view of the component storage unit;

FIG. 4F is a rear view of the component storage unit;

FIG. 5A is a front view of a state in which an electronic component is stored in the component storage unit of the second embodiment;

FIG. 5B is a right side view of the stored state of FIG. 5A;

FIG. 5C is a left side view of the state of FIG. 5A;

FIG. 5D is a bottom view of the state of FIG. 5A;

FIG. 5E is a plan view of the state of FIG. 5A;

FIG. 5F is a rear view of the state of FIG. 5A;

FIG. 6 is a perspective view of a state wherein the component storage unit of the second embodiment is provided with connecting parts in a transfer direction and a plurality of the component storage units are coupled thereby forming a tape-shaped component cluster;

FIG. 9A is a schematic diagram showing a state when the component cluster in the second embodiment of the present invention is inspected by the component inspecting apparatus;

FIG. 9B is a diagram of an inspection state by the component inspecting apparatus to the component cluster of the second embodiment, FIG. 10A is a perspective view of a conventional embossed carrier tape;

FIG. 10B is a sectional view of the embossed carrier tape having a push pin inserted therein;

DETAILED DESCRIPTION OF THE INVENTION

Figure 3:
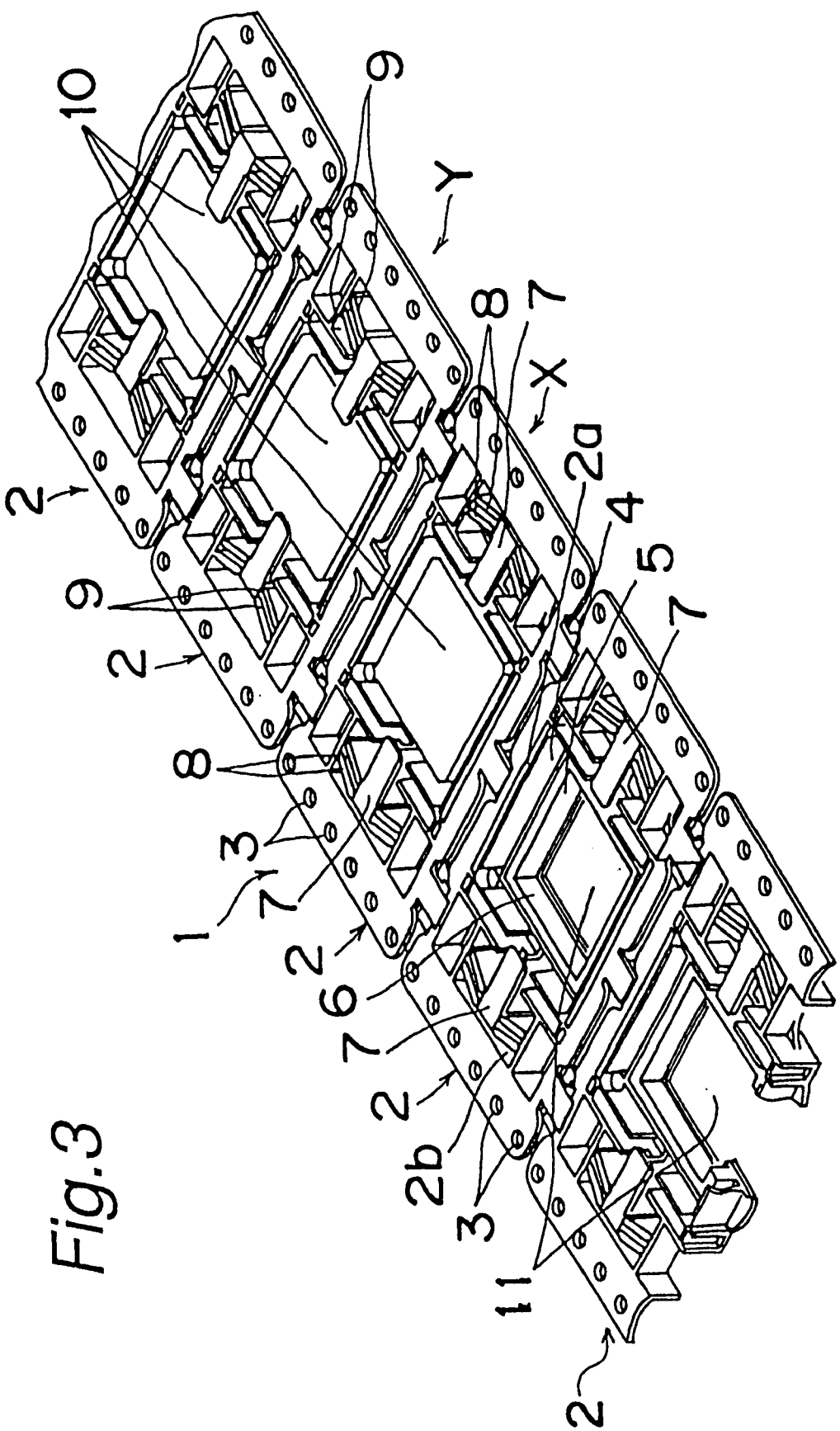
FIG. 3 is a perspective view of a state wherein the component storage unit of the first embodiment is provided with connecting parts in a transfer direction and a plurality of the component storage units are coupled thereby forming a tape-shaped component cluster.

Before the description of the present invention proceeds, it is to be noted that like parts are designated by like reference numerals throughout the accompanying drawings.

Hereinbelow, typical examples of component storage units in various embodiments of the present invention will be discussed with reference to the accompanying drawings.

FIGS. 1A–1F show six views of a component storage unit 2 in a first embodiment of the present invention. More specifically, FIG. 1A is a front view of the component storage unit 2, FIG. 1B is a right side view thereof, FIG. 1C is a left side view thereof, FIG. 1D is a bottom view thereof, FIG. 1E is a plan view thereof, and FIG. 1F is a rear view thereof. FIGS. 2A–2F are six views in a state where an electronic component 10 is stored in the component storage unit 2 of the first embodiment. FIG. 2A is a front view of the state, FIG. 2B is a right side view thereof, FIG. 2C is a left side view thereof, FIG. 2D is a bottom view thereof, FIG. 2E is a plan view thereof, and FIG. 2F is a rear view thereof FIG. 3 is a perspective view of a tape-shaped component cluster obtained by coupling a plurality of the component storage units 2 of the first embodiment at connecting parts provided in their transfer direction. In the drawing, five component storage units 2 are coupled, two of which at ends of the cluster are illustrated in a cutaway view for the sake of convenience.

In FIGS. 1A–1F, FIGS. 2A–2F, and FIG. 3, 1 is the component cluster constructed by the coupled component storage units 2. The component storage unit 2 is an integrally injection molded product of polypropylene or polyethylene. The component storage unit is almost rectangular in plane extending in a direction orthogonal to a couple direction, i.e., direction in which the component storage units are coupled. Feed holes 3 are formed with a predetermined pitch at both side parts of the component storage unit parallel to the couple direction. A flat recess 4 is provided in the component storage unit 2 except its peripheral part, in which a storage space 5 for a component 10 is secured at its central part. A rectangular supporting frame 6 rises at each of four inner side faces of the storage space 5 to support a corresponding outer side face of the component 10. One electronic component 10 is stored in each storage space 5. An inspection pin insertion hole 11 which is a concrete example of an inspection hole is formed at a lower part of the storage space 5 in such a manner as not to obstruct the supporting of the electronic component 10.

An engagement element 7 as an example of a component engagement member is arranged at each side part of the storage space 5. The engagement element 7 is movable between a position where a leading end of the element projects at an upper opening of the storage space 5 and a position where the leading end of the element retreats from the upper opening. When the leading ends of both engagement elements 7 are at the projection positions, the leading ends of the elements 7 are engaged with an upper face of the component 10 stored in the storage space 5, thereby preventing the component 10 from popping out from the storage space 5. At the retreat positions, the leading ends of the engagement elements 7 allow the component 10 to be inserted and supported in the storage space 5 or to be removed from the storage component 5. In FIG. 3, the component storage unit 2 denoted by X is in a state in which the pair of engagement elements 7 are at the retreat positions, and the component storage unit 2 designated by Y is in a state in which the pair of engagement elements 7 are at the projection positions.

Each side of each of the engagement elements 7 is integrally coupled by a pair of link elements 8 to each of the side walls 2a of the component storage unit 2 confronting each other in the couple direction. Each link element 8 is slightly longer than half a length obtained by subtracting a breadth of the engagement element 7 from a distance between the side walls 2a and 2a. At the same time, the link element 8 and the side wall 2a, and the link element 8 and the engagement element 7 are pivotably coupled by a thin self hinge 9. Accordingly, the engagement element 7 is rendered stable at the projection and retreat positions and at the same time movable between the positions by an urging force.

A pair of coupling elements 13 project from one edge in the couple direction of the component storage unit 2 (for instance, an upper edge of the front view in FIG. 2A). The coupling elements 13 are spaced a suitable distance from each other. An engagement projection 12 projects downward at a leading end of the coupling element 13. A positioning pin 16 projects between the pair of coupling elements 13 in the same direction as the engagement projections 12. A pair of projecting parts 15 are provided at the other edge with respect to the couple direction of the component storage unit 2 (e.g., a lower edge of the front view of FIG. 2A) to project at positions corresponding to the coupling elements 13. A coupling hole 14 is formed in each projecting part 15, and the engagement projection 12 is to be fitted therein. Also a positioning hole 17 projects at a position corresponding to the positioning pin 16. The positioning pin 16 is to be fitted in the positioning hole 17, and the pair of engagement projections 12 are fitted and engaged with the corresponding coupling holes 14, whereby the component storage units 2 are coupled with one another thereby constituting the tape-like component cluster 1.

The inspection pin insertion hole 11 enables connecting terminals 18 arranged at the lower face of the electronic component 10 to be exposed, as shown in FIG. 2F, without breaking a support state for the electronic component 10. Particularly, since every contact at the lower face of the electronic component such as a BGA (BALL GRID ARRAY), a QFN (QUAD FLAT NON-LEADED PACKAGE), a CSP (CHIP SIZED PACKAGE), etc. making amazing progress lately can be exposed from the inspection pin insertion hole 11, the inspection pins penetrating the inspection pin insertion hole 11 can be brought in direct contact with the contacts or can execute optical noncontact two-dimensional or three-dimensional measurement to inspect shapes of contact balls, etc.

Next, a component storage unit 22 according to a second embodiment of the present invention will be described with reference to the drawings. FIGS. 4A–4F are six views of the component storage unit 22 of the second embodiment, specifically, FIG. 4A is a front view thereof, FIG. 4B is a right side view thereof, FIG. 4C is a left side view thereof, FIG. 4D is a bottom view thereof, FIG. 4E is a plan view thereof, and FIG. 4F is a rear view thereof. FIGS. 5A–5F are six views of the component storage unit 22 of the second embodiment in a state with an electronic component 30 stored therein. FIG. 5A is a front view thereof, FIG. 5B is a right side view thereof, FIG. 5C is a left side view thereof, FIG. 5D is a bottom view thereof, FIG. 5E is a plan view thereof, and FIG. 5F is a rear view thereof. FIG. 6 is a perspective view of a tape-like component cluster 22 formed of a plurality of component storage units 22 of the second embodiment connected at connecting parts provided in their transfer direction. Five component storage units 22 are coupled in FIG. 6 and two component storage units 22 at both ends of the cluster are shown in a cutaway state for the sake of convenience. In FIGS. 4A–4F, FIGS. 5A–5F, and FIG. 6, 21 denotes the component cluster constituted by coupling the component storage units 22. The component storage unit 22 is formed of a polypropylene or polyethylene injection-molded product in a nearly rectangular shape in a plane extending in a direction orthogonal to the couple direction. Feed holes 23 are formed with a predetermined pitch at both lateral parts of the component storage unit parallel to the couple direction. A flat recess part 24 is also formed in the component storage unit 22 except its peripheral part. A storage space 25 for the component 30 is provided at a central part of the recess 24. A rectangular supporting frame 26 rises at each of four inner side faces of the storage space 25 to hold a corresponding outer side face of a main body of the component 30. The electronic component 30 is accommodated in the storage space 25. An inspection pin insertion hole 31 is formed at a lower part of the storage space 25 without damaging the support to the electronic component 30. 39 is a positioning hole. A positioning pin is inserted from outside at a predetermined position into each of the four positioning holes 39 in the event that position accuracy is required when the component cluster 21 is moved with a predetermined pitch in the couple direction with the use of the feed holes 23. A hole 40 is used to apply a load condition to the electronic component 30 from outside, that is, the hole 40 is formed for a different purpose than that of the above inspection pin insertion hole 31.

An engagement element 27 is arranged at each side part of the storage space 25, and the engagement element 27 is movable between a position where a leading end of the engagement element 27 projects into an upper opening of the storage space 25, and a position where the leading end of the engagement element 27 retreats from the upper opening. The leading ends of the pair of engagement elements 27 at the projection positions are engaged with an upper face of the component 30 stored in the storage space 25, thereby preventing the component 30 from popping out of the storage space 25. While at the retreat positions, the leading ends of the engagement elements 25 enable the component 30 to be inserted and supported in the storage space 25 or to be taken out of the storage space 25. The component storage unit 22 indicated by X in FIG. 6 is in a state in which the leading ends of the pair of engagement elements 27 are at the retreat positions. The component storage unit 22 denoted by Y in FIG. 6 is in a state in which the leading ends of the pair of engagement elements 27 are at the projection positions..

Each of side parts of the engagement element 27 is integrally coupled by a pair of link elements 28 to side walls 22a which confront each other in the couple direction of the component storage unit 22. The link element 28 is formed slightly longer than half of a length obtained by subtracting a breadth of the engagement element 27 from a distance between the side walls 22a and 22a. Moreover, the link element 28 and the side wall 22a, and the link element 28 and the engagement element 27 are respectively coupled by a thin self hinge 29 in such a manner as to pivot freely. Owing to this self hinge, the leading end of each engagement element 27 is not only stable at two positions (projection and retreat positions), but is also movable between the two positions by an urging force.

A pair of coupling elements 33 project at one edge in the couple direction of each component storage unit 22 (e.g., an upper edge of the front view of FIG. 4A), and have downward engagement projections 32 at respective leading ends. A positioning pin 36 projects between the coupling elements 33 in the same direction as the engagement projections 32. At the other edge in the couple direction (for example, a lower edge of the front view in FIG. 4A), there are disposed a pair of projecting parts 35 at positions corresponding to the coupling elements 33, and a positioning hole 37 at a position corresponding to the positioning pin 36. A coupling hole 34 is formed in each projecting part 35 to receive the engagement projections 32. The positioning pin 36 is fitted in the positioning hole 37 and at the same time the pair of engagement projections 32 are inserted and engaged with the coupling holes 34. Consequently, the component storage units 22 can be coupled to form the tape-like component cluster 21.

As shown in FIG. 5F, because of the inspection pin insertion hole 31, connecting terminals 38 arranged at a lower face of the electronic component 30 can be exposed without damaging the support to the electronic component 30. While a semiconductor package used most often at present, i.e., QFP (QUAD FLAT PACKAGE) is exemplified in the second embodiment, all contacts can be exposed in other types of electronic components, for example, an SOP (SMALL OUTLINE PACKAGE) having contact leads extended in a direction from a side face of the component main body which is called a gull wing, a QFJ (QUAD FLAT J-LEADED PACKAGE), or an SOJ (SMALL OUTLINE J-LEADED PACKAGE) having contact leads extended in a direction from a side face of the component main body to turn to a lower face of the component which are called J leads. Accordingly, the. inspection pins are able to penetrate the inspection pin insertion hole 31 to be in direct contact with the contacts of the electronic component or to carry out optical noncontact two-dimensional or three-dimensional measurement, so that shapes, deformations, bends, etc. of the contact terminals can be inspected. Although each of the QFP and QFJ has four inspection pin insertion holes 31, a suitable count of inspection pin insertion holes 31, e.g., two of a suitable size, may be formed in each of the SOP and SOJ depending on a location of the contact terminals.

Figure 7:
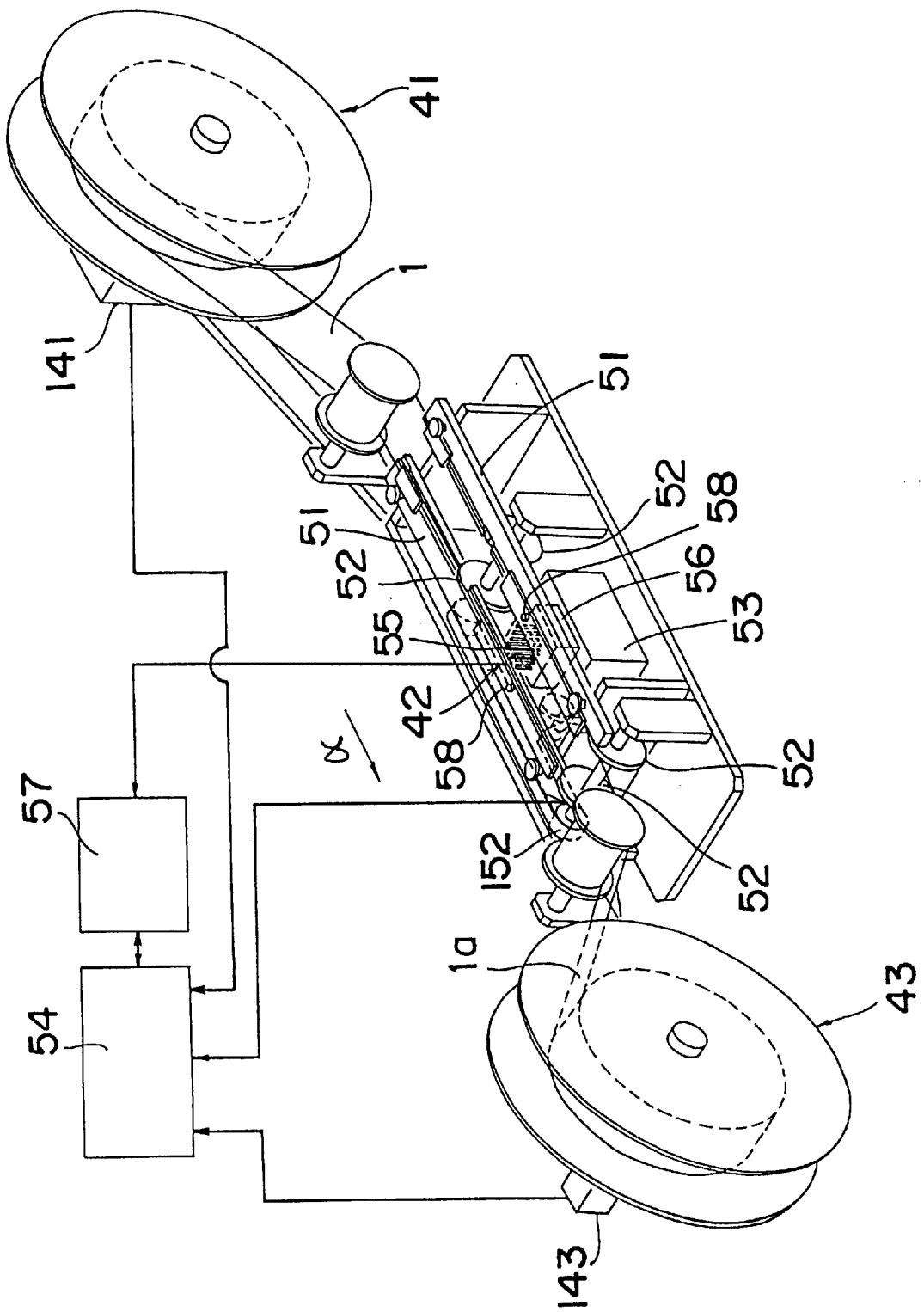
FIG. 7 is a perspective view of a component inspecting apparatus according to a third embodiment of the present invention.
Figure 8:
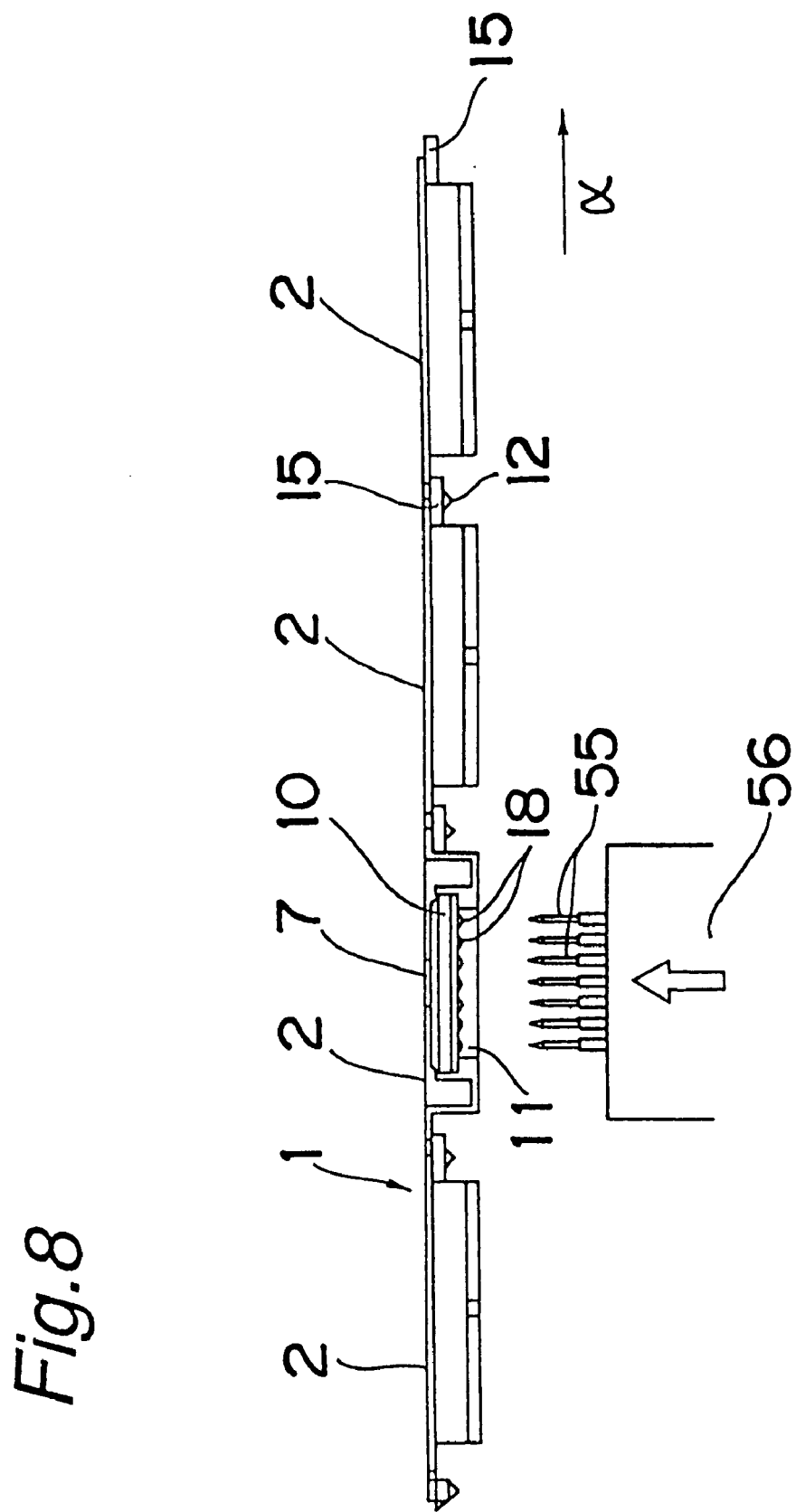
FIG. 8 is a schematic diagram showing a state when the component cluster in the first embodiment of the present invention is inspected by the component inspecting apparatus.
Figure 11:
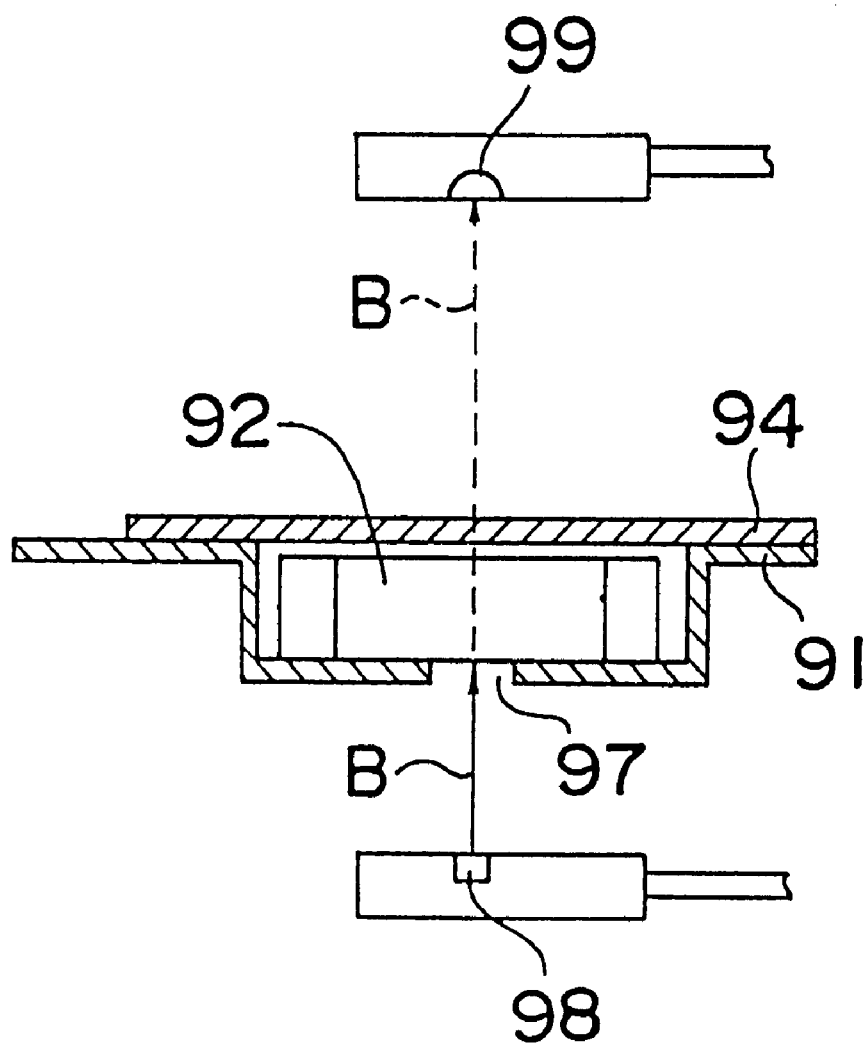
FIG. 11 is a sectional view of the embossed carrier tape when executing confirmation for an absence of the component.
Figure 12A:
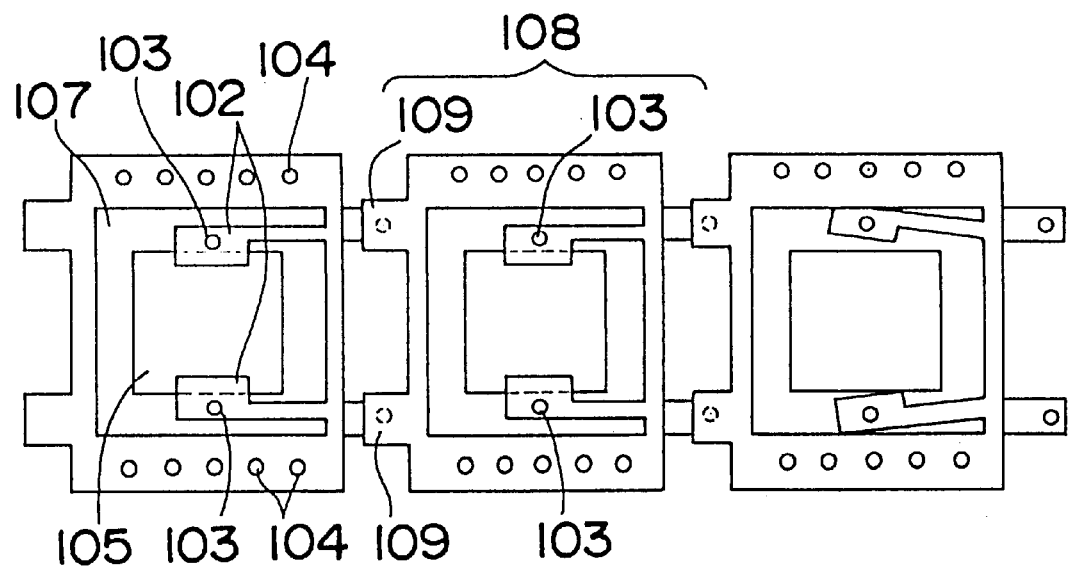
FIG. 12A is a plan view of a component storage unit not requiring a top cover tape.
Figure 12B:
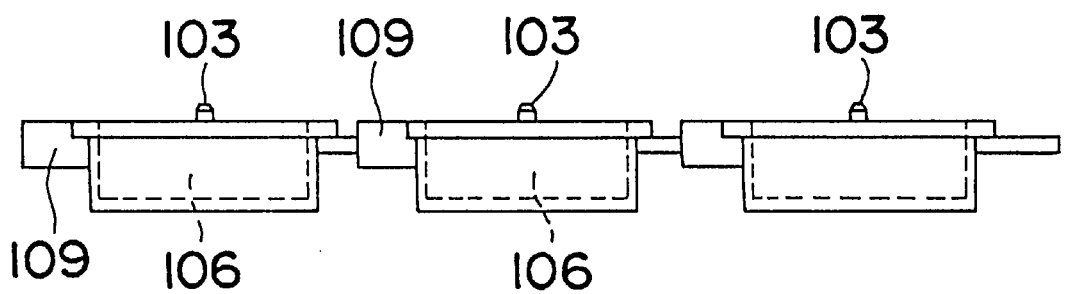
FIG. 12B is a front view of the component storage unit of FIG. 12A.
Figure 13:
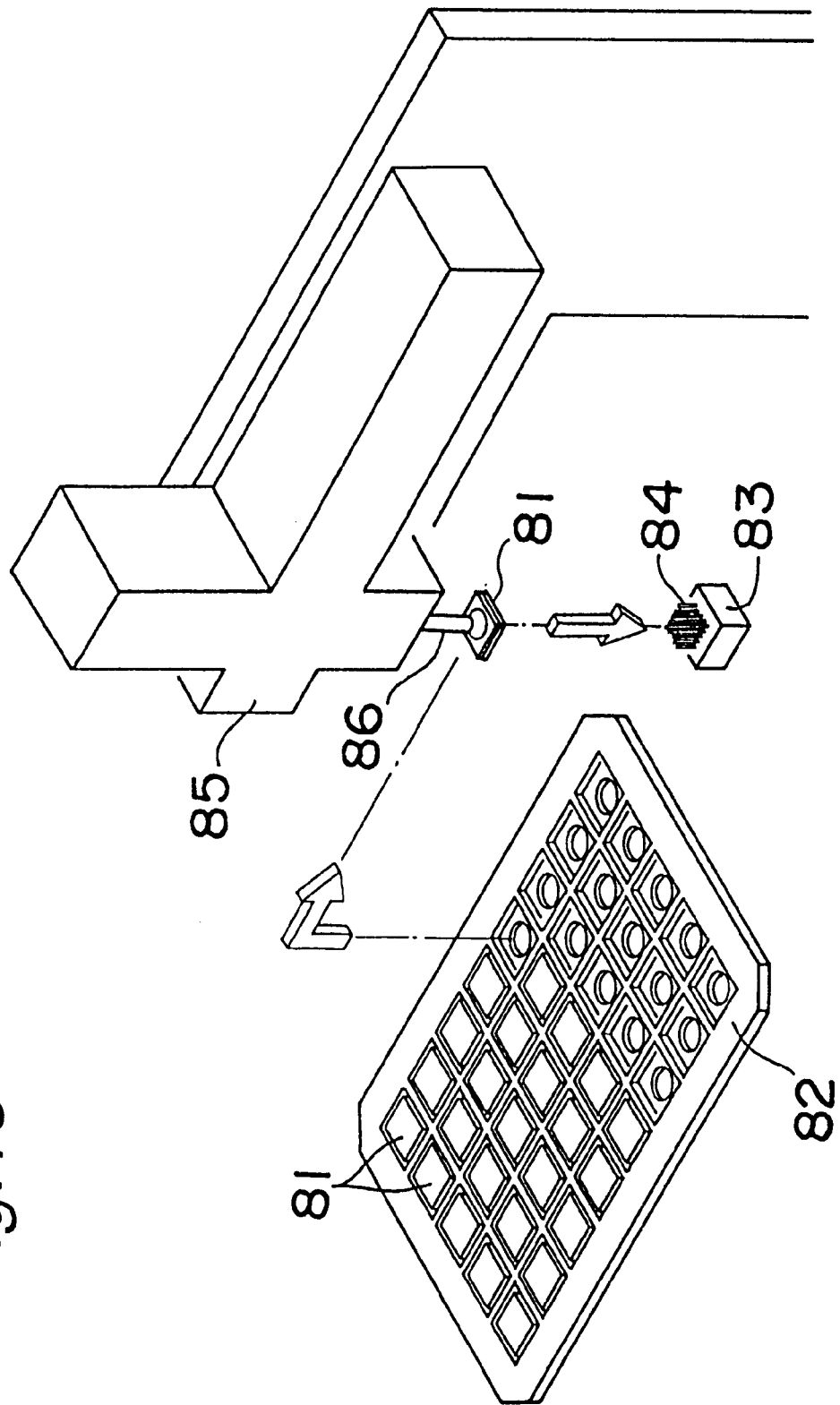
FIG. 13 is a schematic diagram of a conventional component inspection method.

A method and an apparatus for inspecting components according to a third embodiment of the present invention will be described below. FIG. 7 is a perspective view of the component inspecting apparatus in the third embodiment, FIG. 8 is a schematic diagram showing a state in which the component cluster 1 of the first embodiment is inspected, FIG. 9A is a similar diagram schematically showing a state in which the component cluster 21 of the second embodiment is inspected, and FIG. 9B is an inspection state of the component cluster 21 of FIG. 9A.

The component cluster 1 is wound to a feed reel 41 so as to facilitate handling. The component inspecting apparatus includes a pair of guide devices 51, an inspecting apparatus control unit 53, and inspection pins 55, etc. The component storage unit 2 taken out from the feed reel 41 is guided at the right and left sides in its longitudinal direction by the pair of guide devices 51. At this time, the opening part of the component storage space 5 is directed upward. The component storage unit 2 is transferred along the pair of guide devices 51 in order to mesh four sprockets 52 (paired as front and rear and right and left) with the feed holes 3 at both sides of the component storage unit 2 guided by the pair of guide devices 51. An inspection operation to the electronic components 10, etc. is controlled at a component inspection position 42 located at a halfway point of the transfer by the control unit 53 and the inspection pins 55. The component storage unit 2 is thus automatically intermittently transferred along the pair of guide devices 51 in an a direction in FIG. 7 precisely by a transfer control device 54. The transfer control device 54 controls driving of a driving motor 152 synchronously driving the four sprockets 52, and also a driving motor 141 for the feed reel 41, and a driving motor 143 for a wind reel 43 which will be described later. As is clear in FIG. 8, many conductive inspection pins 55 are allotted on a lift stage 56 below the component inspection position 42 where the component storage unit 2 stops. The inspection pins 55 penetrate the inspection pin insertion hole 11 in accordance with an upward movement of the lift stage 56, and then, come in contact with component connecting terminals 18 at the lower face of the electronic component 10. Thus, an electric characteristic inspection is performed on the component 10 by an electric characteristic measurement device 57. The electric characteristic inspection is an example of a state inspection to the component 10. As a more specific example of the electric characteristic inspection, it is detected whether or not a surge current at the turn-on or off time, or a surge voltage at the application of an induction load exceeds an absolute maximum rating. Although the electronic component 10 is apt to be raised in accordance with the rise of the inspection pins 55, the leading ends of the pair of engagement elements 7 are kept at the projection positions at all times at the upper face of the electronic component 10 and therefore, the electronic component 10 can be prevented from popping out of the storage space 5 while a suitable pressure is applied to the connecting terminals 18 at the lower face of the electronic component 10. A connection inspection is enabled accordingly. Upon completion of the inspection, the lift stage 56 descends and the inspection pins 55 descend likewise. The connection between the inspection pins 55 and the component connecting terminals 18 of the electronic component 10 is released. When the intermittent transfer in the α direction of FIG. 7 is repeated with the inspection pins 55 completely retreated below the inspection hole 11 of the component storage unit 2, the inspection can be realized continuously. A component cluster 1a having the inspected electronic components 10 stored therein is taken to the wind reel 43.

761 Referring to FIGS. 9A and 9B, in the case where positioning accuracy is required to bring the inspection pins 55 in contact with the component storage unit 21 of the second embodiment, each positioning pin 58 of the guide devices 51 which is so arranged as to be engaged with the positioning pin hole 39 shown in FIGS. 4A–6 is fixedly engaged with the corresponding positioning pin hole 39 after the component storage unit 22 is transferred to above the component inspection position 42, thereby positioning the component storage unit. Thereafter, the lift stage 56 is raised to bring the inspection pins 55 into contact with the connecting terminals 38 of the component 30. When the electronic component 30 is required to be heated at the inspection time, a heater component 61 is inserted into the heater component insertion hole 40 formed at a bottom face of the component storage unit 22 in FIGS. 4A–6, and a leading end of the heater component 61 is brought in contact with the bottom face of the electronic component 30, thereby heating the electronic component 30. Moreover, when both the heater component 61 and the inspection pins 55 are brought in contact with the electronic component 30 at the same time, the electronic component 30 can be heated and inspected concurrently. Then, a temperature characteristic of the electronic component can be inspected as well.

Figure 14:
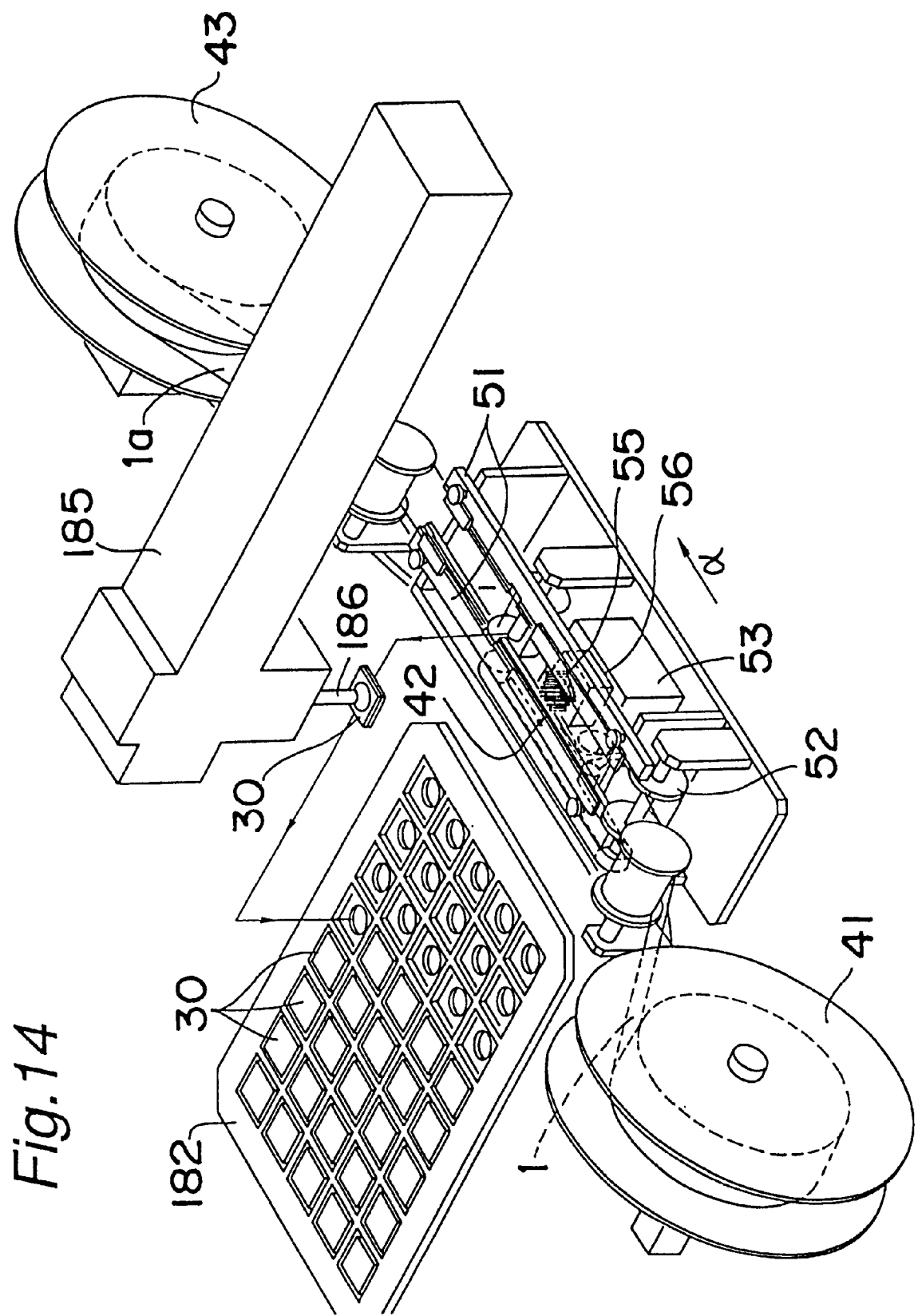
FIG. 14 is a diagram explanatory of a method of removing a defective component from the component storage unit in an inspecting apparatus of a third embodiment of the present invention.

A defective component, if any, is removed from the component storage unit in the inspecting apparatus of the third embodiment of the present invention, a method for which will be described with reference to FIG. 14. During the electric characteristic inspection to the components 10 or 30 by the inspection pins 55 kept in contact with the connecting terminals 18 or 38 of the components 10 or 30, if the electronic component 10 or 30 is judged to fail because of the lack of a required electric characteristic, the engagement of the component 10 or 30 by the engagement elements 7 or 27 of the component storage unit 2 or 22 is released by a release device (not shown). Then the component 10 or 30 is sucked by a nozzle 186 of a component transfer arm 185 and raised from inside the component storage unit 2 or 22. Thereafter, the transfer arm 185 is moved to put the defective component 10 or 30 in a defective component tray 182. The freeing of each engagement element 7 or 27 is executed by moving a projection 7a or 27a projecting at a lower face of the engagement element 7 or 27 in an engagement release direction.

Figure 15:
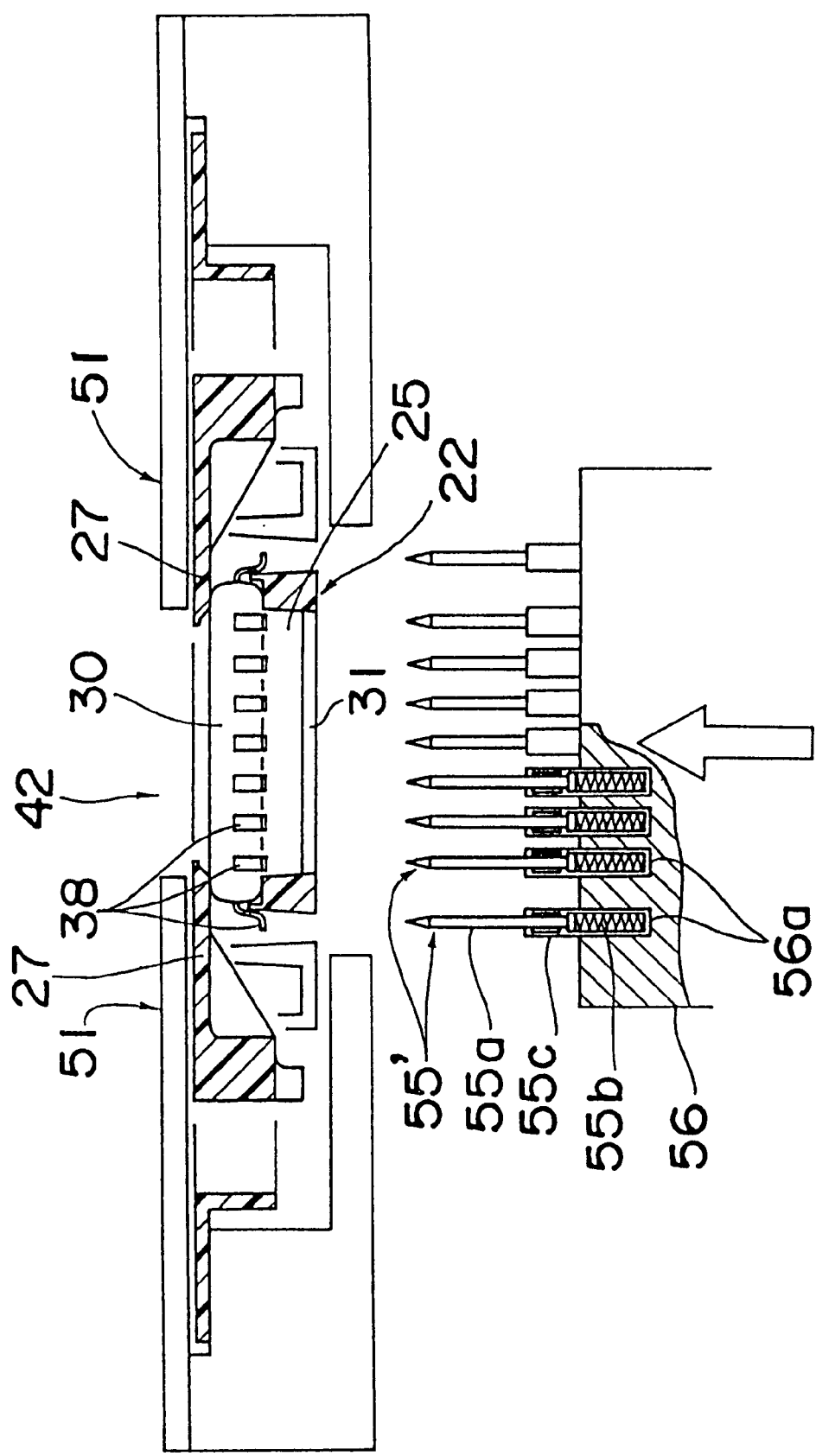
FIG. 15 is a partial sectional front view of a modified example of inspection pins of the inspecting apparatus of the third embodiment of the present invention.
Figure 16:
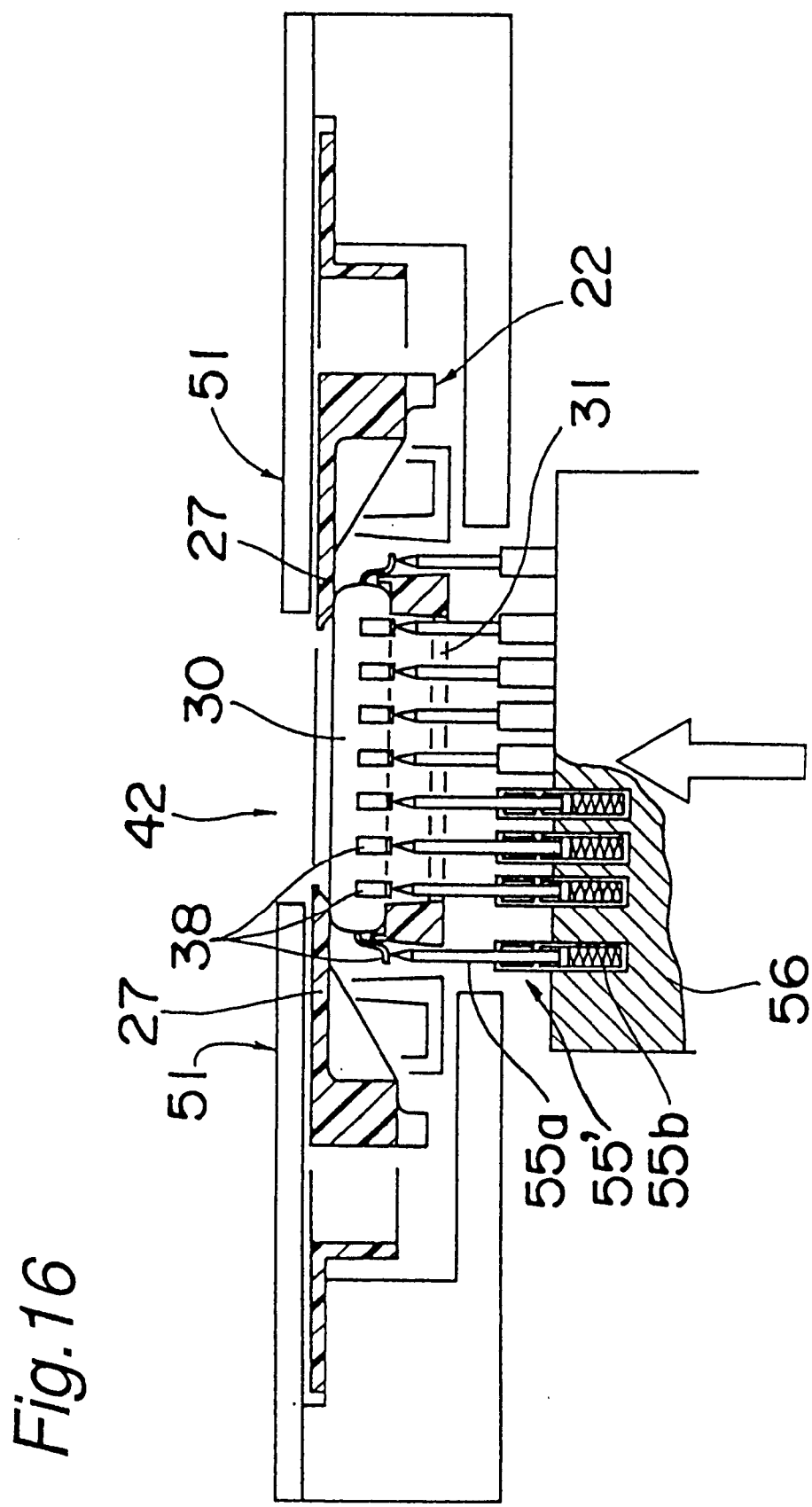
FIG. 16 is a partial sectional, front view of an inspection state in FIG. 15.

Each inspection pin 55 of the above inspecting apparatus may be constituted of one conductive rigid pin or constructed to be able to absorb an impact when coming in contact with the component. For example, as shown in FIGS. 15 and 16, each inspection pin 55' may comprise an inspection pin case 56c securely fitted in a recessed part 56a of the lift stage 56, a spring 56a set in the pin case 56c while being compressed, and an inspection pin main body 56b urged upward at all times by the spring 56a. When the inspection pin 55' comes in contact with the connecting terminal 38 of the component 30, as shown in FIG. 16, the spring 55a eases and absorbs the impact at the time.

Figure 17:
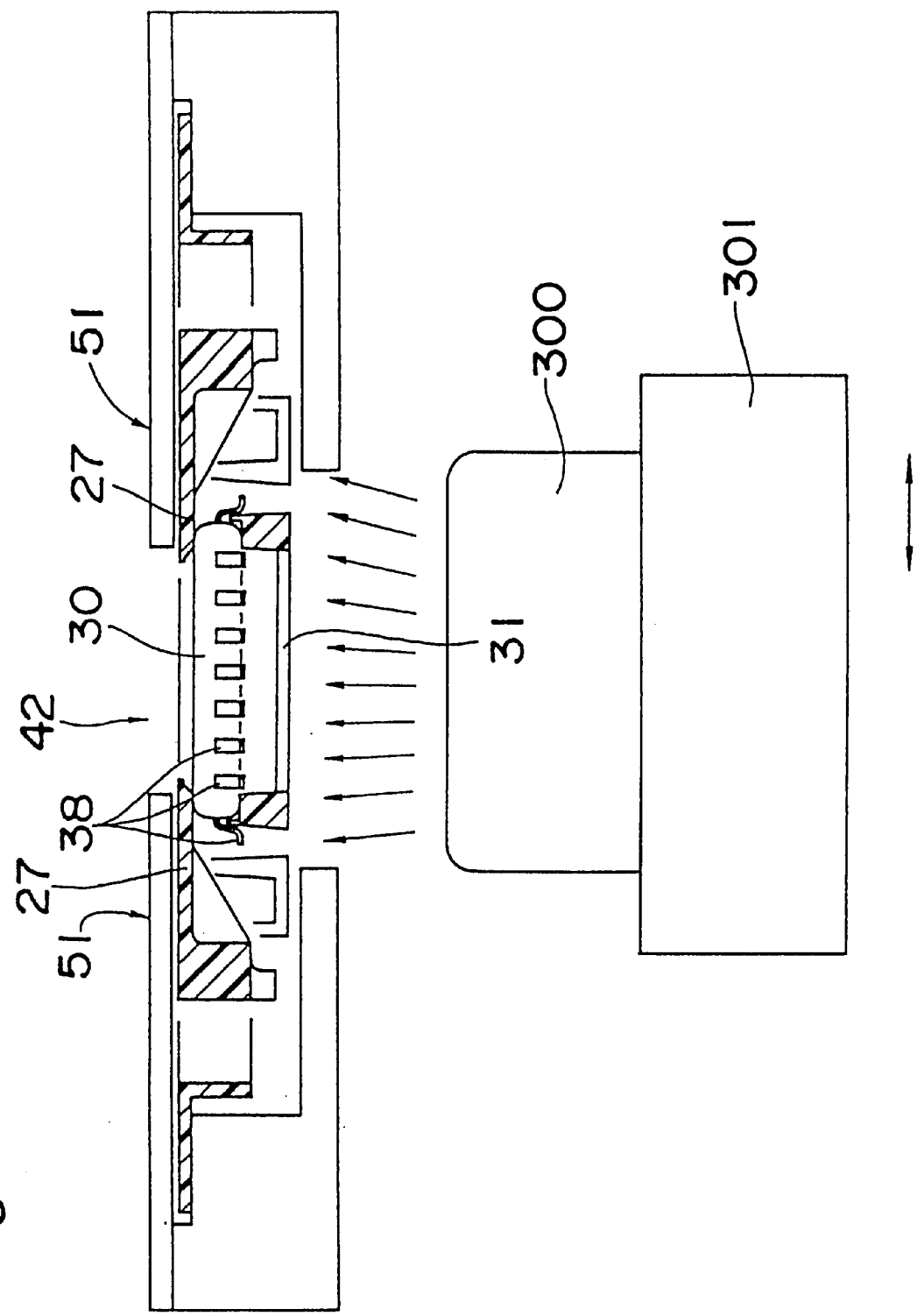
FIG. 17 is a partial sectional, front view when an optical inspecting apparatus is used as the inspecting apparatus of the third embodiment of the present invention.

The inspection method in the above-described various embodiments is based on a contact by the contact terminals. However, an optical inspecting apparatus 300 may be set below the inspection pin insertion hole 11 as shown in FIG. 17, or a visual inspection by eyes from below is also conceivable. The optical-type inspecting apparatus enables measurement and inspection of shapes and bend states of the contact terminals with the use of a three-dimensional laser or the like. In this case, the component storage units may be continuously, not intermittently, transferred in the a direction. The optical inspecting apparatus 300 can be fixed on a table 301 which is movable in a direction orthogonal to the transfer direction of the component storage units, so that the components in the component storage units can be scanned when the inspecting apparatus moves in the orthogonal direction at the inspection time.

Although the component in the above embodiments is the electronic component, the present invention is not limited to this and is applicable to mechanical, optical components, etc.

As described above, according to the present invention, the component storage unit is provided with the engagement member at the opening part of the receptacle having the component storage recess for storing the component. The engagement member is releasably engaged with at least a part of the upper face of the stored component thereby holding the component at a predetermined position. The component storage unit includes the inspection hole at a part of the storage recess so that a state of the stored component is inspected from the outside. Accordingly, even when the component is directly stored in the component storage unit immediately after being produced as a product, an inspection member such as the inspection pins or the like can be inserted from the outside of the component storage unit through the inspection pin insertion hole provided at the component storage unit for inspecting the state of the component and brought into contact with the connecting terminals of the stored component. Although the stored component is inclined to pop out from the component storage unit at this time due to an external force applied upon contact with the inspection member, the component is prevented from popping out of the component storage unit because the engagement member holds at least a part of the upper face of the stored component at the predetermined position. Moreover, a suitable pressure is applied to the component from the inspection member. Accordingly the component can be inspected while it is kept in the component storage unit, thereby eliminating not only an additional time for moving the component to an intermediate storage container such as a tray or the like besides the inspection time, but also an instruction work to the component transfer apparatus to transfer the component to the intermediate storage container. Thus, efficiency during the inspection process is improved.

A plurality of the component storage units can be coupled in the transfer direction into the tape-shaped component cluster. In this arrangement, the component cluster holding components therein can be continuously sent above the inspection member, hence enabling continuous inspection to the components.

The entire disclosure of Japanese Patent Application No. 8-274425 filed on Oct. 17, 1997, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus comprising:
   a component storage unit including:
      a storage recess for storing a component therein, said storage recess having an opening to allow insertion of the component;
      an engagement element having a leading-end portion at said opening of said storage recess, said leading-end portion of said engagement element being operable to engage and release an upper face of the component to be stored in said storage recess so as to hold the component at a predetermined position; and
      an inspection hole in said storage recess for allowing inspection of the component to be stored in said storage recess from outside of said storage recess; and
   an inspection member for inspecting the component to be stored in said storage recess, said inspection member being operable to penetrate through said inspection hole of said component storage unit so as to contact the component to be stored in said storage recess, wherein said leading end portion of said engagement element, said inspection hole, and said inspection member are arranged such that said leading-end portion engages the upper face of the component when said inspection member penetrates through said inspection hole of said storage recess so as to prevent the component from being pushed out of said storage recess.

2. The apparatus of claim 1, wherein said inspection member comprises a plurality of conductive inspection pins for contacting a set of connecting terminals on the component to be stored in said storage recess so as to conduct an electric-characteristic inspection of the component.

3. The apparatus of claim 2, wherein said engagement element is integrally molded from a resin material and is adapted to hold an engagement release position and an engagement position by an elastic force of said resin material.

4. The apparatus of claim 2, wherein said engagement element is operable to move relative to said opening of said storage recess between an engagement release position, whereat the component to be stored in said storage recess is released, and an engagement position, whereat the component to be stored in said storage recess is engaged.

5. The apparatus of claim 2, further comprising a heating member for heating the component to be stored in said storage recess, wherein said component storage unit further includes a heating hole in said storage recess for allowing said heating member to penetrate therethrough.

6. The apparatus of claim 2, further comprising a plurality of said component storage units coupled to form a band.

7. A method of inspecting the component to be stored in the apparatus of claim 2, comprising inspecting the component through the inspection hole in the storage recess so as to determine if the component is good.

8. The apparatus of claim 1, wherein said engagement element is integrally molded from a resin material and is adapted to hold an engagement release position and an engagement position by an elastic force of said resin material.

9. The apparatus of claim 8, wherein said engagement element is operable to move relative to said opening of said storage recess between the engagement release position, whereat the component to be stored in said storage recess is released, and the engagement position, whereat the component to be stored in said storage recess is engaged.

10. The apparatus of claim 8, further comprising a heating member for heating the component to be stored in said storage recess, wherein said component storage unit further includes a heating hole in said storage recess for allowing said heating member to penetrate therethrough.

11. The apparatus of claim 8, further comprising a plurality of said component storage units coupled to form a band.

12. A method of inspecting the component to be stored in the apparatus of claim 8, comprising inspecting the component through the inspection hole in the storage recess so as to determine if the component is good.

13. The apparatus of claim 1, wherein said engagement element is operable to move relative to said opening of said storage recess between an engagement release position, whereat the component to be stored in said storage recess is released, and an engagement position, whereat the component to be stored in said storage recess is engaged.

14. The apparatus of claim 13, further comprising a heating member for heating the component to be stored in said storage recess, wherein said component storage unit further includes a heating hole in said storage recess for allowing said heating member to penetrate therethrough.

15. The apparatus of claim 13, further comprising a plurality of said component storage units coupled to form a band.

16. A method of inspecting the component to be stored in the apparatus of claim 13, comprising inspecting the component through the inspection hole in the storage recess so as to determine if the component is good.

17. The apparatus of claim 1, further comprising a heating member for heating the component to be stored in said storage recess, wherein said component storage unit further includes a heating hole in said storage recess for allowing said heating member to penetrate therethrough.

18. The apparatus of claim 17, further comprising a plurality of said component storage units coupled to form a band.

19. A method of inspecting the component to be stored in the apparatus of claim 17, comprising inspecting the component through the inspection hole in the storage recess so as to determine if the component is good.

20. The apparatus of claim 1, further comprising a plurality of said component storage units coupled to form a band.

21. The apparatus of claim 20, further comprising a transfer apparatus for transferring said band, wherein said inspection member comprises a plurality of inspection pins to be inserted through said inspection hole for contacting a set of connecting terminals on the component to be stored in said storage recess so as to conduct an electric-characteristic inspection of the component.

22. A method of inspecting the component to be stored in the apparatus of claim 1, comprising inspecting the component through the inspection hole in the storage recess so as to determine if the component is good.

23. The method of claim 22, wherein said inspecting of the component comprises penetrating the inspection hole of the storage recess with the inspection member such that the inspection member contacts connecting terminals of the component to be stored in the storage recess so as to conduct an electric-characteristic inspection of the component.

24. The method of claim 22, wherein said inspecting of the component comprises projecting light onto the component through the inspection hole of the storage recess using an optical inspecting apparatus so as to conduct a shape-characteristic inspection of the component.

25. The method of claim 24, wherein the shape-characteristic of the component comprises the state of a set of connecting terminals on the component.

* * * * *